(12) United States Patent
Nagano et al.

(10) Patent No.: US 11,916,473 B2
(45) Date of Patent: Feb. 27, 2024

(54) POWER SUPPLY DEVICE AND POWER SUPPLY SYSTEM

(71) Applicant: OMRON Corporation, Kyoto (JP)

(72) Inventors: Masaaki Nagano, Kusatsu (JP);
Tomonori Watanabe, Kusatsu (JP)

(73) Assignee: OMRON Corporation, Kyoto (JP)

( * ) Notice: Subject to any disclaimer, the term of this patent is extended or adjusted under 35 U.S.C. 154(b) by 558 days.

(21) Appl. No.: 17/266,632

(22) PCT Filed: Jun. 5, 2019

(86) PCT No.: PCT/JP2019/022365
§ 371 (c)(1),
(2) Date: Feb. 8, 2021

(87) PCT Pub. No.: WO2020/066134
PCT Pub. Date: Apr. 2, 2020

(65) Prior Publication Data
US 2021/0302239 A1    Sep. 30, 2021

(30) Foreign Application Priority Data

Sep. 28, 2018 (JP) .................................. 2018-183819

(51) Int. Cl.
*H02M 1/32* (2007.01)
*G01K 3/00* (2006.01)
(Continued)

(52) U.S. Cl.
CPC ............ *H02M 1/327* (2021.05); *G01K 3/005* (2013.01); *G01K 3/10* (2013.01); *H02M 3/24* (2013.01)

(58) Field of Classification Search
CPC ................................ H02M 1/327; H02M 3/24
See application file for complete search history.

(56) References Cited

U.S. PATENT DOCUMENTS

2011/0191059 A1    8/2011  Farrell et al.
2013/0037533 A1    2/2013  Namekawa et al.
(Continued)

FOREIGN PATENT DOCUMENTS

CN          1439867       9/2003
CN        101087125      12/2007
(Continued)

OTHER PUBLICATIONS

"Search Report of Europe Counterpart Application", dated May 17, 2022, p. 1-p. 7.

(Continued)

*Primary Examiner* — Mirellys Jagan
(74) *Attorney, Agent, or Firm* — JCIPRNET (57) ABSTRACT

This power supply device (100) is provided with a power supply unit (10), a temperature sensor (28) for measuring the internal temperature of the power supply unit (10), a calculation circuit (22) for predicting an end-point temperature from the internal temperature of the power supply unit (10) measured by the temperature sensor (28) and the slope of the internal temperature rise and estimating a surrounding temperature on the basis of the end-point temperature and the load status of the power supply unit (10); and a display circuit (23) for displaying the surrounding temperature estimated by the calculation circuit (22).

6 Claims, 10 Drawing Sheets

(51) Int. Cl.
*G01K 3/10* (2006.01)
*H02M 3/24* (2006.01)

(56) References Cited

U.S. PATENT DOCUMENTS

| | | |
|---|---|---|
| 2014/0239741 A1 | 8/2014 | Cade et al. |
| 2014/0349565 A1 | 11/2014 | Flood et al. |
| 2015/0103450 A1 | 4/2015 | Fox et al. |

FOREIGN PATENT DOCUMENTS

| | | | | |
|---|---|---|---|---|
| CN | 102782512 | | 11/2012 | |
| CN | 107632272 | | 1/2018 | |
| CN | 108549001 | | 9/2018 | |
| JP | 2003022127 | | 1/2003 | |
| JP | 2009281985 | | 12/2009 | |
| JP | 2011119428 | | 6/2011 | |
| JP | 2011188649 | | 9/2011 | |
| JP | 2013169963 | | 9/2013 | |
| JP | 2016031628 A | * | 3/2016 | |
| JP | wo2018167954 A1 | * | 6/2019 | |
| JP | 2019187189 A | * | 10/2019 | |
| KR | 20100026858 | | 3/2010 | |
| KR | 101747342 | | 6/2017 | |
| WO | 2016162940 | | 10/2016 | |
| WO | 2018167954 | | 9/2018 | |
| WO | WO-2018235325 A1 | * | 12/2018 | ............. G01R 31/36 |

OTHER PUBLICATIONS

"International Search Report (Form PCT/ISA/210) of PCT/JP2019/022365", dated Jul. 16, 2019, with English translation thereof, pp. 1-4.

"Written Opinion of the International Searching Authority (Form PCT/ISA/237) of PCT/ JP2019/022365", dated Jul. 16, 2019, with English translation thereof, pp. 1-6.

"Office Action of China Counterpart Application", dated Dec. 1, 2023, with English translation thereof, pp. 1-15.

* cited by examiner

POWER SUPPLY DEVICE AND POWER SUPPLY SYSTEM

CROSS-REFERENCE TO RELATED APPLICATION

This application is a 371 application of the International PCT application serial no. PCT/JP2019/022365, filed on Jun. 5, 2019, which claims the priority benefits of Japan Patent Application No. 2018-183819, filed on Sep. 28, 2018. The entirety of each of the above-mentioned patent applications is hereby incorporated by reference herein and made a part of this specification.

TECHNICAL FIELD

The present disclosure relates to a power supply device capable of estimating a surrounding temperature, and a power supply system including the power supply device.

BACKGROUND ART

A power supply device monitors an operating environment such as a cumulative actual operating time and an internal temperature and notifies a user of a replacement time of parts. Specifically, a power management unit described in Japanese Laid-Open No. 2003-22127 (Patent Literature 1) includes a temperature measurement unit which measures an internal temperature of the power management unit, stores a temperature and an operating time measured by the temperature measurement unit in a storage unit, and uses this data to recalculate an operating time of a power supply unit at regular intervals. Then, the power management unit creates display data regarding the operating time of the power supply unit according to the result.

Further, a power supply monitoring device described in Japanese Laid-Open No. 2009-281985 (Patent Literature 2) includes a sensor which detects a surface temperature of a smoothing capacitor and a surrounding temperature of the device (in-panel temperature), and a temperature analog amount from the sensor is introduced into a calculation unit such as a microcomputer via an analog and digital conversion unit. Further, in the monitoring device, the calculation unit performs a self-diagnosis of an abnormality and a lifespan, and when a result thereof is equal to or more than a specified value, an error is displayed, or an alarm is output.

CITATION LIST

Patent Literature

[Patent Literature 1]
Japanese Laid-Open No. 2003-22127
[Patent Literature 2]
Japanese Laid-Open No. 2009-281985

SUMMARY OF INVENTION

Technical Problem

When a temperature sensor is built in as in the devices described in Patent Literature 1 and Patent Literature 2, it is conceivable to estimate the surrounding temperature of the power supply device using the temperature measured by the temperature sensor. It takes a certain amount of time from a start of the power supply device to stabilization of the internal temperature of the power supply device. Therefore, it is necessary to wait for a relatively long time to estimate the surrounding temperature of the power supply device.

An objective of the present disclosure is to make it possible to estimate a surrounding temperature of a power supply device in a shorter time.

Solution to Problem

According to one example of the present disclosure, a power supply device is provided. The power supply device includes a power supply unit, a measurement unit which measures an internal temperature of the power supply unit, a calculation unit which predicts an end-point temperature from the internal temperature of the power supply unit measured by the measurement unit and a slope of an internal temperature rise and estimates a surrounding temperature based on the end-point temperature and a load status of the power supply unit, and an output unit which outputs the surrounding temperature estimated by the calculation unit.

According to the disclosure, the end-point temperature is predicted from a change in the internal temperature. Since the surrounding temperature is estimated based on the predicted temperature, there is no need to wait for the internal temperature to stabilize. Thus, it is possible to estimate the surrounding temperature of the power supply device in a short time.

In the above-described disclosure, the power supply device may further include a storage unit which stores a correspondence table of the surrounding temperature based on the internal temperature and the load status. The calculation unit may estimate the surrounding temperature corresponding to the predicted end-point temperature and the load status from the correspondence table stored in the storage unit.

According to the disclosure, the power supply device estimates the surrounding temperature using the correspondence table stored in advance. Therefore, the surrounding temperature can be estimated by predicting the end-point temperature.

In the above-described disclosure, the measurement unit may measure a value of a temperature sensor as the internal temperature, and the temperature sensor detects a temperature of a component constituting the power supply unit.

According to the disclosure, the internal temperature of the power supply device can be easily measured by regarding a temperature of a component which is a heat source as the internal temperature of the power supply device.

In the above-described disclosure, the power supply device may generate an alarm when the slope of the internal temperature rise exceeds a predetermined value.

According to the disclosure, the power supply device can predict whether or not the final temperature reaches a temperature which causes trouble (a malfunction or the like) of an operation of the power supply device by predicting a transition of the internal temperature. At the stage of the prediction, the power supply device can generate an alarm. Therefore, measures can be taken to prevent the malfunction of the power supply device.

According to one example of the present disclosure, a power supply system is provided. The power supply system includes the power supply device described in any one of the above-described configurations, and a calculation processing device which obtains an operating state of the power supply device at the surrounding temperature estimated by the power supply device. The calculation processing device compares the operating state of the power supply device that is obtained with a predetermined usage condition for display on a display unit.

According to the disclosure, a current operating state of the power supply device can be displayed based on the current surrounding temperature and load factor.

In the above-described disclosure, the calculation processing device may also display a time-series change in the operating state of the power supply device on the display unit.

According to the disclosure, it is possible to show a user the time-series change.

Advantageous Effects of Invention

According to the present disclosure, it is possible to estimate a surrounding temperature of a power supply device in a shorter time.

DESCRIPTION OF EMBODIMENTS

Hereinafter, an embodiment will be described in detail with reference to the drawings. In the drawings, the same reference numerals indicate the same or corresponding parts.

§ 1 Application Example

Figure 1:
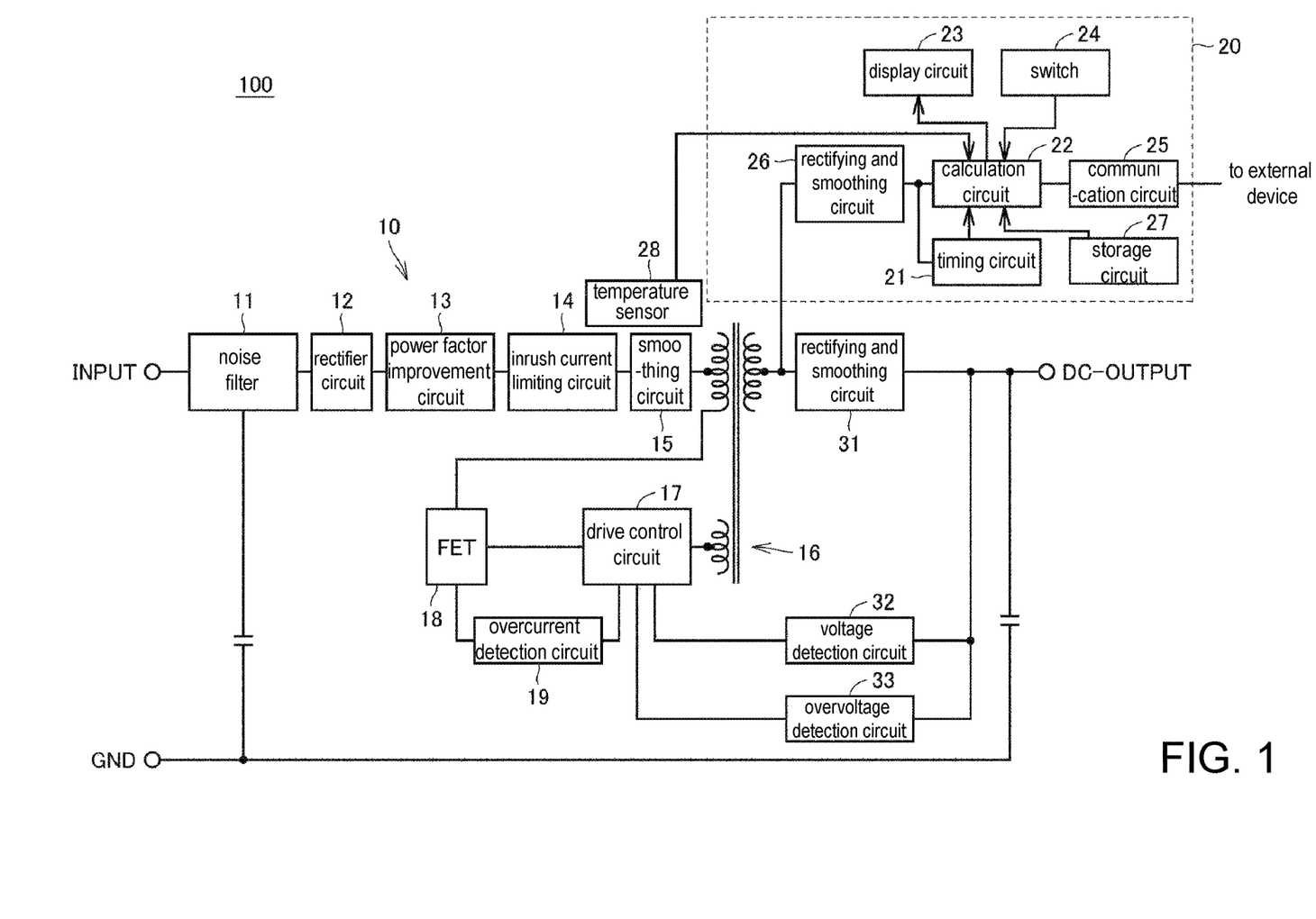
FIG. 1 is a block diagram for explaining a configuration of a power supply device according to an embodiment of the present disclosure.

A configuration of a power supply device according to an embodiment of the present disclosure will be described with reference to the drawings. FIG. 1 is a block diagram for explaining the configuration of the power supply device according to the embodiment of the present disclosure. The power supply device 100 shown in FIG. 1 is a switching power supply device and includes a power supply unit 10, a control unit 20, and a temperature sensor 28.

The temperature sensor 28 is a measurement unit which measures an internal temperature of a power supply device 100. The control unit 20 includes a calculation circuit 22 and a display circuit 23. The calculation circuit 22 predicts an end-point temperature inside the power supply unit 10 from the internal temperature of the power supply unit 10 measured by the temperature sensor 28 and a slope of an internal temperature rise. The calculation circuit 22 estimates a surrounding temperature of the power supply device 100 based on the predicted end-point temperature and a load status of the power supply unit 10. The display circuit 23 corresponds to an output unit which outputs the surrounding temperature estimated by the calculation circuit 22.

In order for the internal temperature of the power supply device 100 to stabilize, it is necessary for a certain amount of time to have passed since the power supply device 100 started. Therefore, it is necessary to wait a relatively long time to estimate the surrounding temperature of the power supply device. In the embodiment, the calculation circuit 22 predicts an end point of the temperature from a time change of the temperature when the internal temperature of the power supply device 100 rises. Then, the calculation circuit 22 estimates the surrounding temperature based on the predicted temperature of the end point (that is, the predicted end-point temperature) and the load status of the power supply unit 10. It is not necessary to wait for the temperature inside the power supply device 100 to stabilize because the end point of the temperature is predicted. Therefore, according to the embodiment, it is possible to provide a power supply device capable of estimating the surrounding temperature of the device in a shorter time.

§ 2 Specific Example

A. Configuration Example of Power Supply Device

The configuration of the power supply device 100 will be described in detail with reference to FIG. 1. The power supply unit 10 includes a noise filter 11, a rectifier circuit 12, a power factor improvement circuit 13, an inrush current limiting circuit 14, a smoothing circuit a transformer 16, a drive control circuit 17, a MOSFET 18, an overcurrent detection circuit 19, a rectifying and smoothing circuit 31, a voltage detection circuit 32, and an overvoltage detection circuit 33.

When an AC power supply (for example, a 50 Hz/60 Hz, 100 V/200 V commercial power supply) is connected to INPUT of the noise filter 11, a high frequency noise component superimposed on the AC power is filtered, and the AC power from which the noise component is removed is supplied to the rectifier circuit 12.

The rectifier circuit 12 is configured of a full-wave rectifier circuit of a diode bridge, and the AC power supplied from the noise filter 11 is made into a full-wave rectified pulsating current to generate primary side DC power.

The power factor improvement circuit 13 is a circuit for curbing a harmonic current generated in an input current, and is also called a power factor correction (PFC) circuit. The inrush current limiting circuit 14 is configured of, for example, a resistor and a relay inserted in parallel with the resistor, and opens the relay for several tens of milliseconds from the start to prevent an inrush current, and then closes the relay to start the power supply. The smoothing circuit 15 is configured of a smoothing capacitor and smooths full-wave rectified AC power.

The drive control circuit 17 is configured of a control IC including a pulse width modulation (PWM) signal generator, a feedback control circuit, an overcurrent protect (OCP) terminal, a switching drive terminal, a drive power supply terminal, and the like, and supplies a high frequency PWM signal to a gate of the MOSFET 18 to drive the MOSFET 18.

Further, the drive control circuit 17 feeds back a voltage on the secondary side (the output side) detected by the voltage detection circuit 32 via a photo-coupler (not shown). Then, the drive control circuit 17 changes a duty ratio of the PWM signal based on the voltage, and drives the MOSFET 18 so that an output voltage of the DC power supply becomes a predetermined value. Further, the overcurrent detection circuit 19 is provided between the drive control circuit 17 and the MOSFET 18.

The MOSFET 18 is connected in series with a primary winding of the transformer 16 and interrupts primary DC power supply in response to the PWM signal supplied from the drive control circuit 17 to generate high frequency pulse power (the AC power) to the primary winding.

The transformer 16 is configured of an isolation transformer in which the primary side and the secondary side are electrically insulated, includes a primary winding, a secondary winding, and an auxiliary winding, and induces the high frequency pulse power (the AC power) generated in the primary winding to the secondary winding and the auxiliary winding. The high frequency pulse power (the AC power) induced in the secondary winding is used for the DC output power, and the high frequency pulse power (the AC power) induced in the auxiliary winding is used for starting the drive control circuit 17.

The rectifying and smoothing circuit 31 is configured of a half-wave rectifying circuit of a diode and a smoothing capacitor, half-wave rectifies the high frequency pulse power (the AC power) induced in the secondary winding and then smooths it to generate DC output power having a predetermined output voltage and output current. The generated DC output power is output from DC-OUTPUT.

The voltage detection circuit 32 detects an output voltage of the DC output power with a corresponding step-down voltage and outputs it to the drive control circuit 17 via a photo-coupler (not shown). The overvoltage detection circuit 33 is provided between the output side of the DC output power and the drive control circuit 17 via a photo-coupler (not shown).

The control unit 20 includes a timing circuit 21, the calculation circuit 22, the display circuit 23, a switch 24, a communication circuit 25, a rectifying and smoothing circuit 26, and a storage circuit 27.

The timing circuit 21 is a timer which measures an operating time of the power supply unit 10. The timing circuit 21 measures a time when the DC output power is generated from the DC-OUTPUT, and does not measure a non-energized time.

The calculation circuit 22 is a circuit which integrates a time measured by the timing circuit 21 to calculate an integrated operating time or to calculate a remaining life span or the surrounding temperature. Further, the calculation circuit 22 also performs display control of the display circuit 23, reception of a switching signal input from the switch 24, control of the communication circuit 25, and the like. The calculation circuit 22 is configured of a central processing unit (CPU) which serves as a control center, a read only memory (ROM) which stores a program or control data for operating the CPU and the like, a random access memory (RAM) which serves as a work area for the CPU, and an input and output interface which maintains signal consistency with peripheral devices, and the like.

Figure 2:
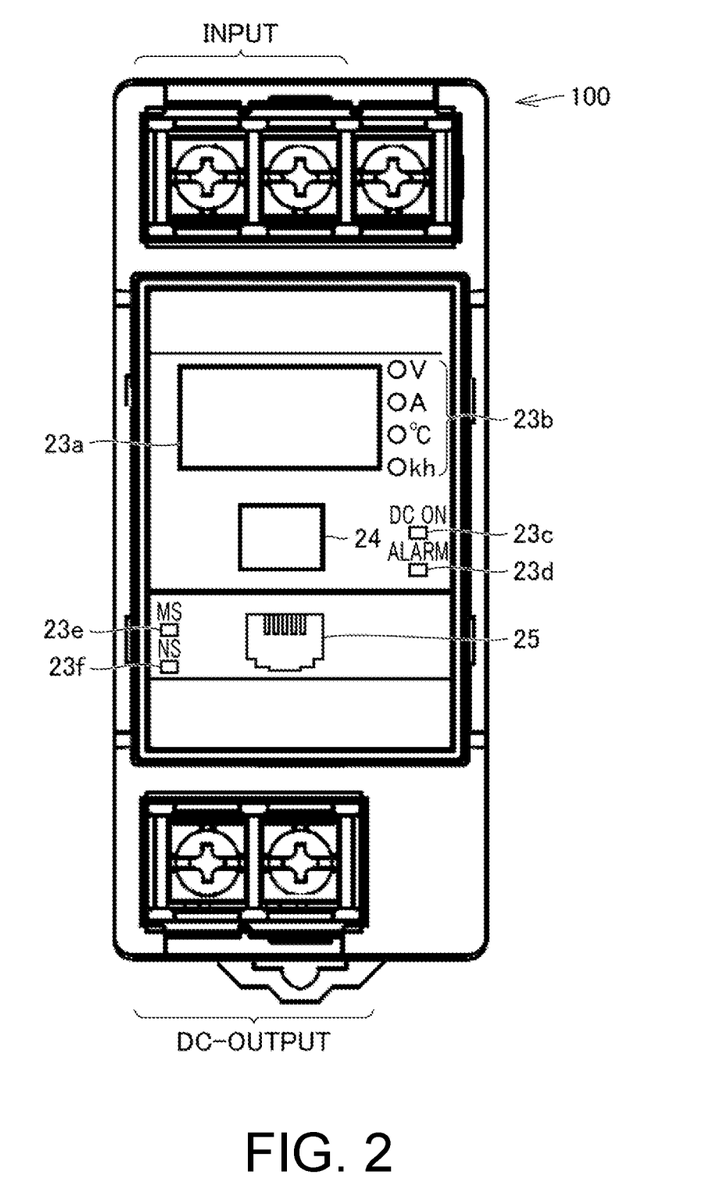
FIG. 2 is a diagram schematically showing an example of an exterior of the power supply device according to the embodiment of the present disclosure.

The display circuit 23 is a display device provided on a surface of the power supply device 100. FIG. 2 is a diagram schematically showing an example of an exterior of the power supply device according to the embodiment of the present disclosure. In the power supply device 100 shown in FIG. 2, display circuits 23a to 23f, the switch 24, and the communication circuit 25 are provided on a surface on which an INPUT terminal and a DC-OUTPUT terminal are provided.

The display circuit 23a is configured of, for example, a 3-digit-display 7-segment LED and can display an output voltage, an output current, an integrated operating time, a remaining life span, a surrounding temperature, and the like. The display circuit 23a may be an LCD, an organic EL display, or the like. The display circuit 23b is configured of four LED lamps arranged on the lateral side of the display circuit 23a and indicates the content of the value displayed on the display circuit 23a by the lit LED lamps. For example, when the LED lamp located next to "V" is lit, the value displayed on the display circuit 23a indicates the output voltage of the power supply device 100. When the LED lamp located next to "A" is lit, the value displayed on the display circuit 23a indicates the output current of the power supply device 100. When the LED lamp located next to "° C." is lit, the value displayed on the display circuit 23a indicates the surrounding temperature of the power supply device 100. When the LED lamp located next to "kh" is lit, the value displayed on the display circuit 23a indicates information on the lifespan of the power supply device 100.

The display circuit 23c is configured of the LED lamp located below the display circuit 23b, and the lighting of the LED lamp indicates that a DC voltage is output from the power supply device 100. The display circuit 23d is configured of the LED lamp located below the display circuit 23c, and the lighting of the LED lamp indicates that an abnormality has occurred in the power supply device 100. The display circuit 23e and the display circuit 23f are configured of two LED lamps arranged on the lateral side of the communication circuit 25, and the lighting of the LED lamps indicates a communication status in the communication circuit 25.

The switch 24 is a display changeover switch and switches the content displayed by the display circuit 23. When a user presses the switch 24, a switching signal is input to the calculation circuit 22. The calculation circuit 22 switches and displays information displayed on the display circuit 23a based on the input switching signal. For example, whenever the user presses the switch 24, the information displayed on the display circuit 23a is switched in the order of information on the output voltage, the output current, the surrounding temperature, and the life span (the integrated operating time or the remaining life span) of the power supply unit 10.

The communication circuit 25 is a circuit for communicating with an external device, and is, for example, a wired network (for example, Ethernet (registered trademark)). As shown in FIG. 2, a connection terminal of the wired network is provided on a surface of the power supply device 100 on which the display circuit 23a is provided. The communication circuit 25 is not limited to the wired network, and known units such as Universal Serial Bus (USB) communication, serial communication, parallel communication, and a wireless network (for example, a wireless LAN or BLUETOOTH (registered trademark)) can be used. The switching signal for switching the display content of the display circuit 23 can be input from an external device via the communication circuit 25, or the information on the surrounding temperature and the lifespan of the power supply unit 10 (the integrated operating time, the remaining life span, and the like) can be output from the calculation circuit 22 to an external device.

The rectifying and smoothing circuit 26 is configured of a half-wave rectifying circuit of a diode and a smoothing capacitor, and half-wave rectifies high-frequency pulse power (an AC power) induced in the secondary winding and then smooths it to generate DC output power having a specified output voltage and output current. The generated DC output power is used to start the control unit 20.

The storage circuit 27 is a circuit for storing information such as the internal temperature of the power supply device 100 measured by the temperature sensor 28, a correspondence table for estimating the surrounding temperature of the power supply device 100, and the lifespan of the power supply unit 10. The storage circuit 27 is configured of a non-volatile storage device such as a flash memory. The correspondence table stored in the storage circuit 27 can be updated or edited by an external device via the communication circuit 25.

Figure 3:
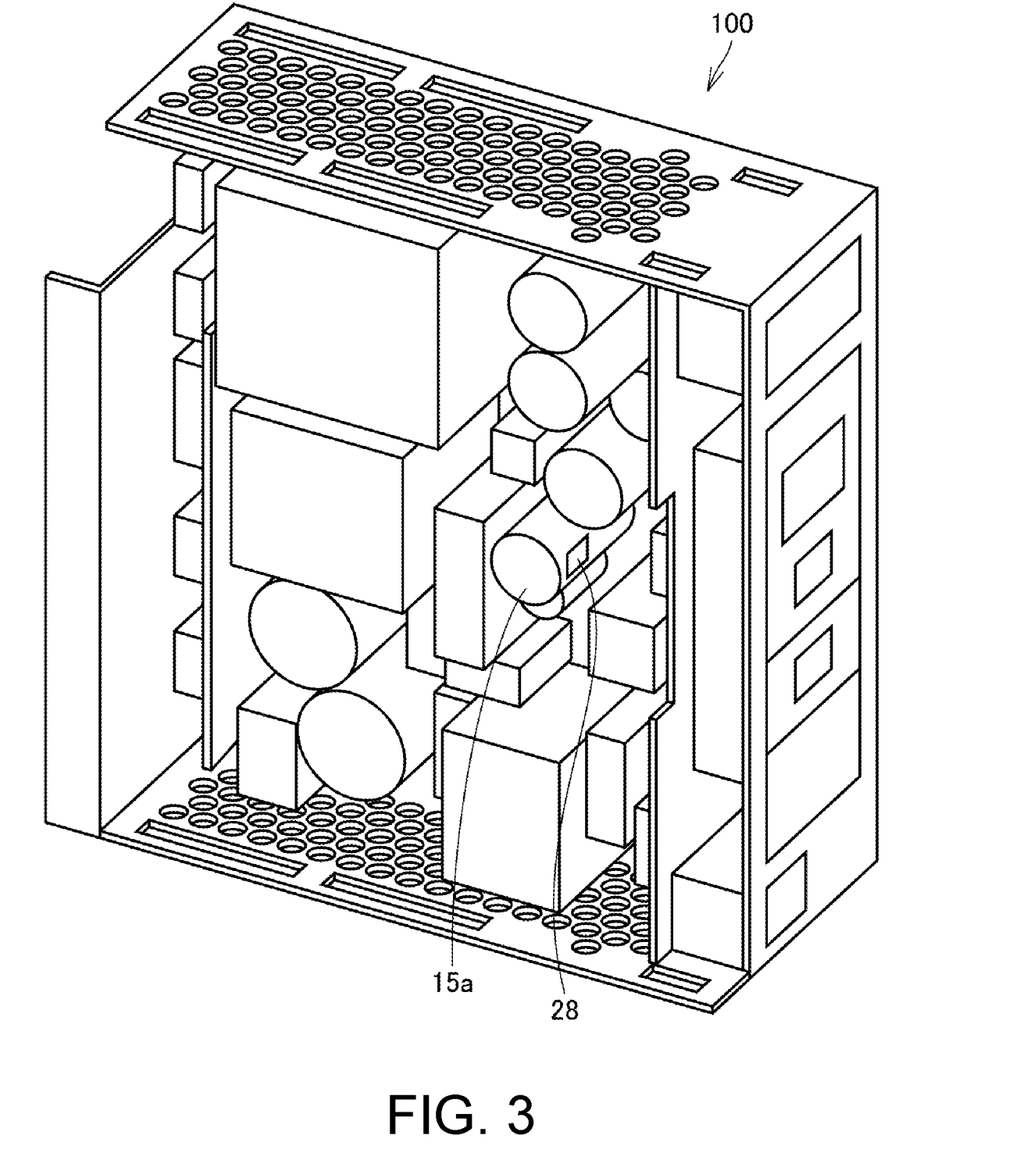
FIG. 3 is a diagram schematically showing an example of an inner portion of the power supply device according to the embodiment of the present disclosure.

The temperature sensor 28 is a sensor for measuring a temperature of an electrolytic capacitor used in the smoothing circuit 15 or the like. FIG. 3 is a diagram schematically showing an example inside the power supply device according to the embodiment of the present disclosure. In the power supply device 100 shown in FIG. 3, the temperature sensor 28 is attached to a side surface of an electrolytic capacitor 15*a* provided in the device. The temperature sensor 28 can measure the internal temperature of the power supply device 100, particularly the temperature of the electrolytic capacitor 15*a*.

In the electrolytic capacitor used for the smoothing circuit 15 or the like of the power supply device 100, an impregnated electrolytic solution permeates a sealing rubber from the time of manufacture, and the internal electrolytic solution evaporates with time, and thus deterioration of characteristics such as a decrease in capacitance occurs. A lifespan of this electrolytic capacitor largely depends on the lifespan of the power supply unit 10. Therefore, the calculation circuit 22 calculates the remaining life span of the power supply unit 10 based on the internal temperature of the power supply device 100 measured by the temperature sensor 28.

An amount of deterioration of the electrolytic capacitor varies greatly according to the internal temperature of the power supply device 100. In general, it is known that the amount of deterioration of the electrolytic capacitor is about doubled when the surrounding temperature changes by about 10° C. according to Arrhenius's chemical reaction kinetics. Therefore, as shown in FIG. 3, the calculation circuit 22 monitors the temperature of the electrolytic capacitor in operation using the temperature sensor 28, and calculates the remaining life span of the power supply unit 10 from the operating time and the internal temperature.

A position at which the temperature sensor 28 is provided is not limited to the side surface of the electrolytic capacitor 15*a*, and may be near an internal component (a capacitor, an FET, or the like) of the power supply device 100 or a portion inside the power supply device 100 in which heat generation is large. The internal temperature of the power supply device can be easily measured by regarding a temperature of a component which is a heat source as the internal temperature of the power supply device.

B. Estimation and Display of Surrounding Temperature

Figure 4:
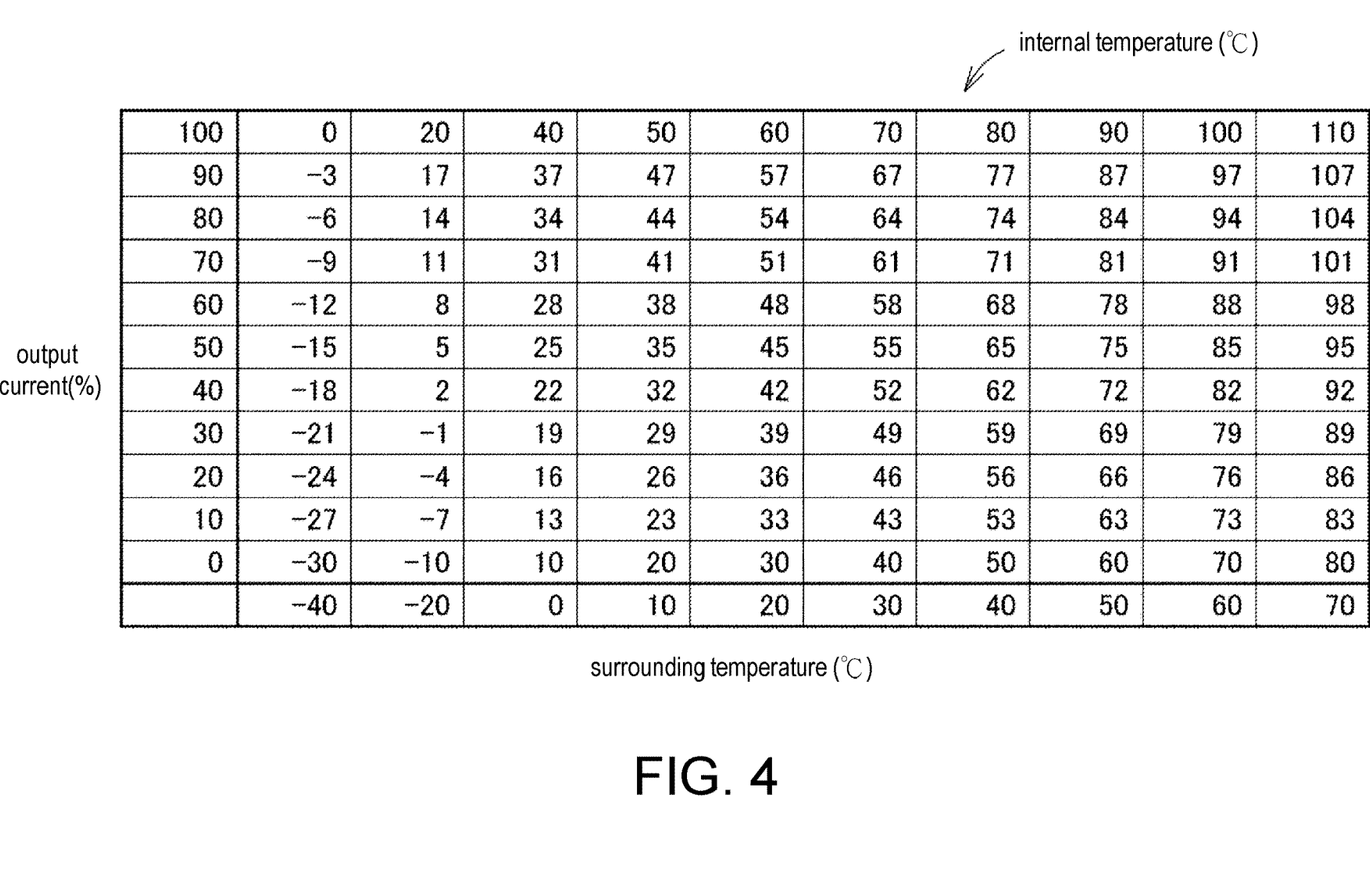
FIG. 4 is a diagram showing an example of a correspondence table of a surrounding temperature used in the power supply device according to the embodiment of the present disclosure.

The temperature sensor 28 measures the internal temperature of the power supply device 100 not only to calculate the remaining life span of the power supply unit 10, but also to estimate the surrounding temperature of the power supply device 100. Specifically, the calculation circuit 22 estimates the surrounding temperature based on the internal temperature of the power supply device 100 measured by the temperature sensor 28 and the load status of the power supply unit 10. In order to estimate the surrounding temperature, the calculation circuit 22 uses a correspondence table of the surrounding temperature based on the internal temperature and the load status stored in the storage circuit 27. FIG. 4 is a diagram showing an example of the correspondence table of the surrounding temperature used in the power supply device according to the embodiment of the present disclosure. In the correspondence table of the surrounding temperature shown in FIG. 4, the output current (unit: %, a maximum output current is 100%) is described as the load status in the left column, and the surrounding temperature (unit: ° C.) is indicated by a value in the lower column identified by the output current and the internal temperature (unit: ° C.) measured by the temperature sensor 28. For example, when the output current of the power supply device 100 is 50% and the internal temperature measured by the temperature sensor 28 is 45° C., since the value in the lower column of the correspondence table is 20, it can be estimated that the surrounding temperature of the power supply device 100 is 20° C.

The correspondence table of the surrounding temperature shown in FIG. 4 differs according to a specification and a model of the power supply device 100, and is stored in the storage circuit 27 in advance by a manufacturer. Of course, the correspondence table of the surrounding temperature can be updated via the communication circuit 25 and can be changed or edited by a user.

Since the internal temperature of the power supply device 100 rises according to the load status of the power supply unit 10, the surrounding temperature of the power supply device 100 can be estimated by subtracting a temperature rise from the internal temperature of the power supply device 100 measured by the temperature sensor 28. Specifically, the power supply device 100 can obtain electric power from the output current and the output voltage measured as the load status of the power supply unit 10, can calculate the internal temperature rise due to the electric power and can estimate the surrounding temperature from a difference between the internal temperature and the temperature rise. In the correspondence table of the surrounding temperature shown in FIG. 4, the estimated values of the surrounding temperature are summarized as a table corresponding to the internal temperature and the load status. The load status of the power supply unit 10 may be the output current of the power supply unit 10 or the electric power of the power supply unit 10 as shown in the correspondence table of the surrounding temperature shown in FIG. 4. Of course, the load status of the power supply unit may be any value as long as it is a value related to at least one of the output current and the output voltage of the power supply unit 10.

Figure 5:
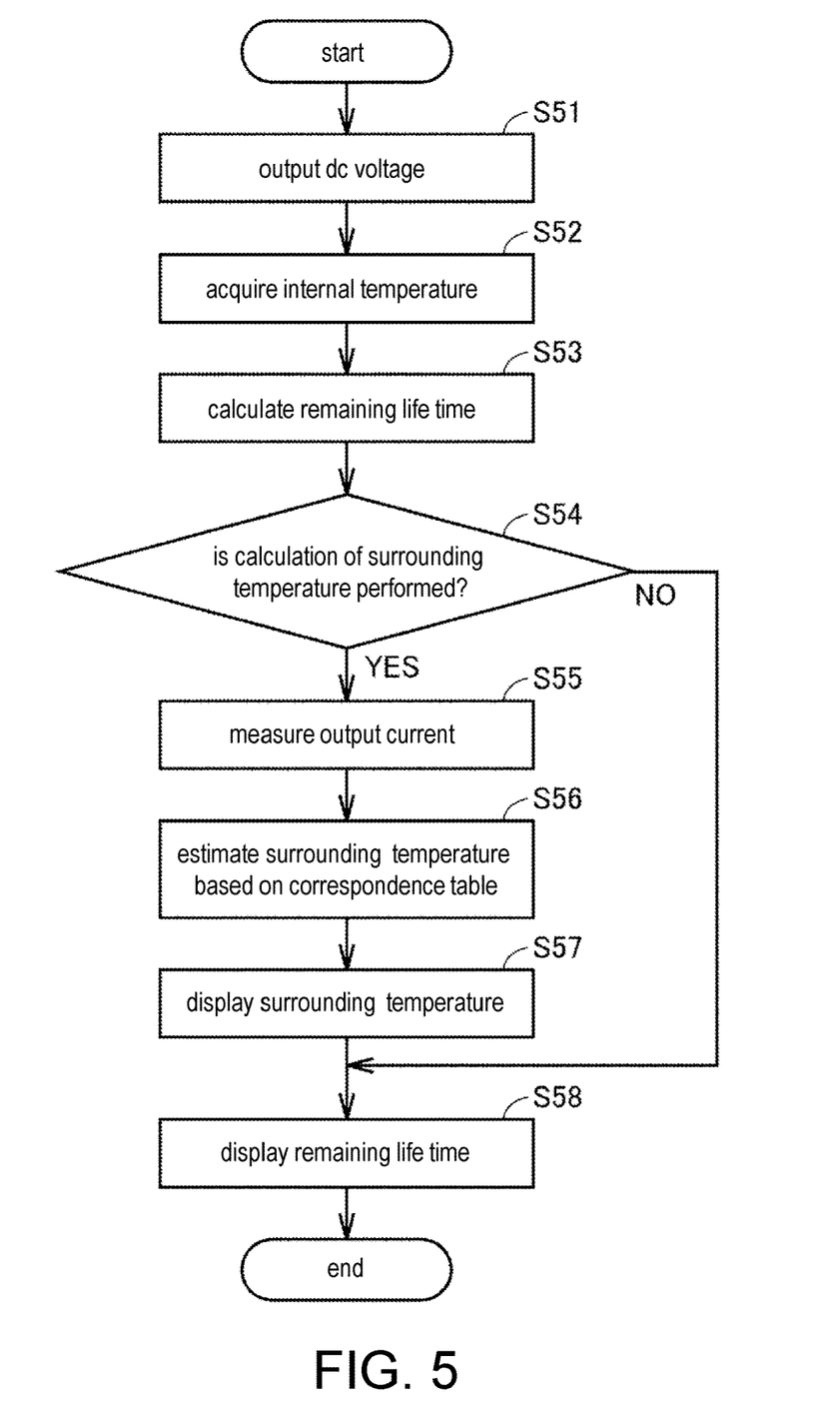
FIG. 5 is a flowchart for explaining a process of estimating the surrounding temperature in the power supply device according to the embodiment of the present disclosure.

Next, in the power supply device 100, a process of estimating and displaying the surrounding temperature will be described with reference to a flowchart. FIG. 5 is a flowchart for explaining a process of estimating the surrounding temperature in the power supply device according to the embodiment of the present disclosure.

First, the power supply device 100 outputs a DC voltage from the terminal of the DC-OUTPUT (Step S51). The calculation circuit 22 acquires the internal temperature of the power supply device 100 based on the measured value of the temperature sensor 28 (Step S52). The calculation circuit 22 calculates the remaining life span of the power supply unit 10 based on the acquired internal temperature of the power supply device 100 (Step S53).

Next, the calculation circuit 22 determines whether or not the surrounding temperature of the power supply device 100 will be calculated according to whether or not an operation in which the surrounding temperature of the power supply device 100 is displayed is performed by pressing the switch 24 (Step S54). When it is determined that the surrounding temperature of the power supply device 100 will be calculated (Step S54: YES), the calculation circuit 22 acquires the measured value obtained by measuring the output current (Step S55). The calculation circuit 22 estimates the surrounding temperature of the power supply device 100 from the internal temperature of the power supply device 100 and the measured value of the measured output current based on the correspondence table of the surrounding temperature shown in FIG. 4 (Step S56). The calculation circuit 22 causes the display circuit 23 to display the estimated surrounding temperature of the power supply device 100 (Step S57).

When it is determined that the surrounding temperature of the power supply device 100 will be not calculated (Step S54: NO), or after the surrounding temperature of the power supply device 100 is displayed on the display circuit 23, the calculation circuit 22 causes the display circuit 23 to display the calculated remaining lifespan of the power supply unit 10 (Step S58).

The calculation circuit 22 calculates the remaining life span based on the internal temperature of the power supply device 100 (the temperature of the electrolytic capacitor) measured by the temperature sensor 28, and calculates information on the life span of the power supply unit 10.

Figure 6:
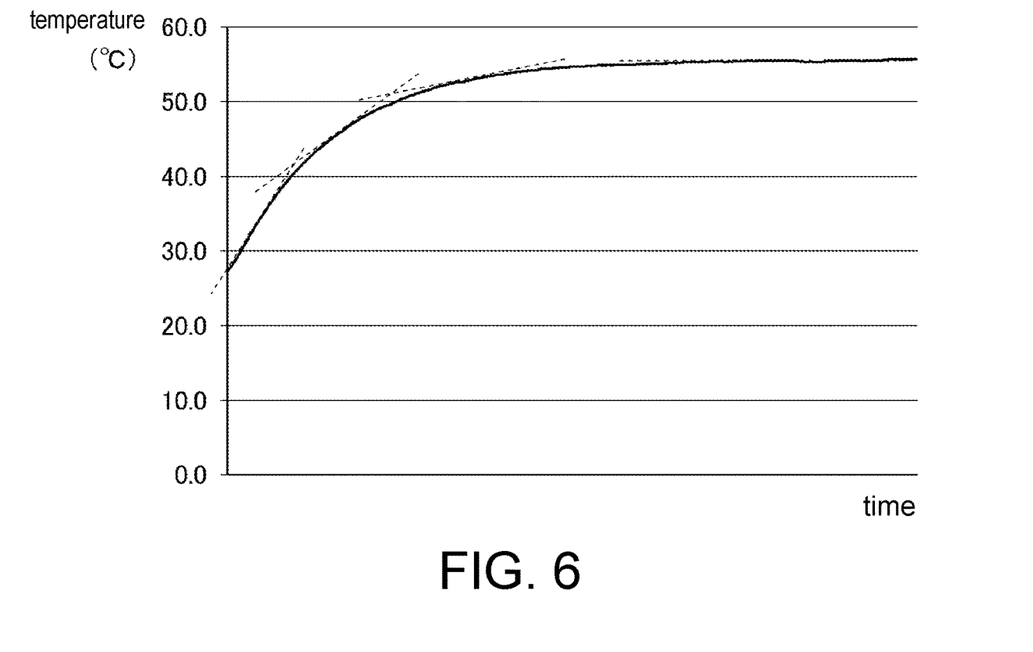
FIG. 6 is a diagram showing a change over time in an internal temperature of the power supply device.

Next, the acquisition of the internal temperature of the power supply device 100 performed in Step S52 will be described in detail. FIG. 6 is a diagram showing a change over time in the internal temperature of the power supply device 100. As shown in FIG. 6, the internal temperature of the power supply device 100 rises significantly at the beginning (at start-up). A rate of the internal temperature rise of the power supply device 100 decreases with the passage of time, and the internal temperature of the power supply device 100 stabilizes after a certain period of time. Therefore, a slope of the temperature is large at the beginning and decreases with the passage of time.

In the embodiment, the power supply device 100 itself grasps the output voltage. Therefore, the power supply device 100 can predict a final end-point temperature based on an output electric power, a temperature rise value, and an elapsed time from the start-up.

Figure 7:
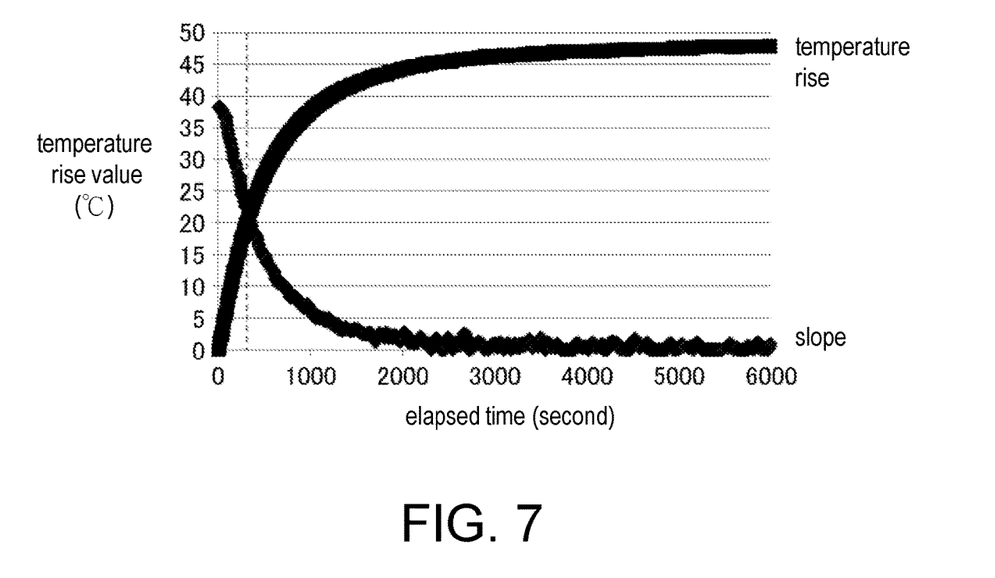
FIG. 7 is a diagram showing a time course of temperature rise and slope of the temperature of the power supply device.

FIG. 7 is a diagram showing a time course of the temperature rise and the slope of the temperature of the power supply device 100. FIG. 7 shows the temperature rise value with respect to the elapsed time when an output of the power supply device 100 is 100% of the rating. As a value indicating the slope becomes larger, the temperature rise value increases. At the beginning (when the power supply device 100 starts), the slope of the temperature rise becomes large, and then the slope of the temperature rise gradually decreases. For example, when the slope after 10 seconds is calculated to be 20, the calculation circuit 22 predicts that the internal temperature of the power supply device 100 will rise by 20 to 30° C. from a current temperature. When the current temperature is 70° C., the end-point temperature is calculated to be 90° C. to 100° C.

In the embodiment, the power supply device 100 stores the temperature rise value for each output (a load factor). The power supply device 100 calculates an expected value of the temperature rise based on the slope of the temperature rise. Thus, the power supply device 100 predicts the internal temperature and acquires the predicted value.

According to the embodiment, it is possible to determine from the rise in the internal temperature of the power supply device 100 whether or not the internal temperature of the power supply device 100 reaches a temperature which causes trouble (a malfunction, or the like) in operation. When a rise value of the internal temperature exceeds a predetermined threshold value, the power supply device 100 can generate an alarm for notifying the user of the fact.

Figure 8:
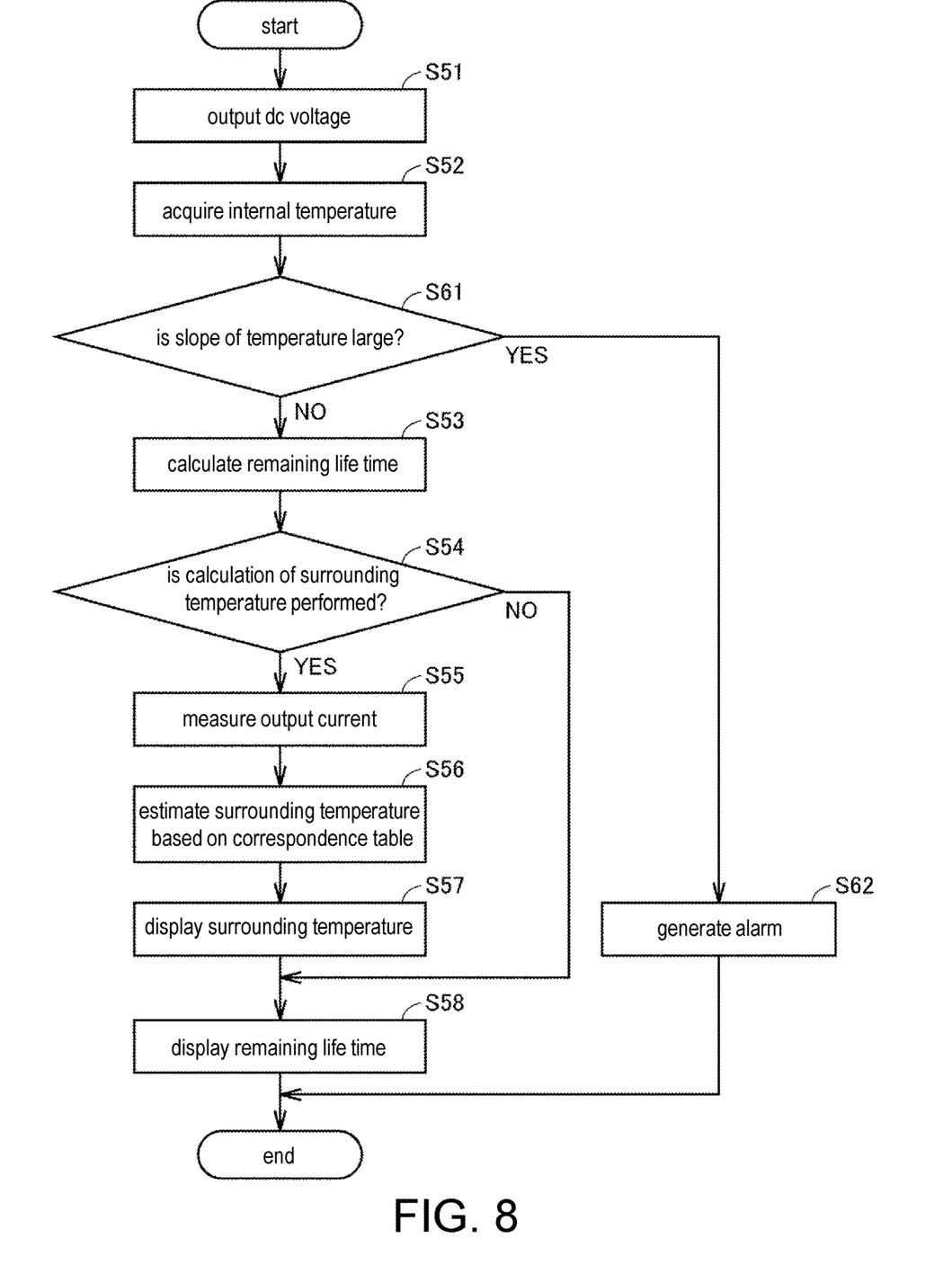
FIG. 8 is a flowchart corresponding to monitoring of the surrounding temperature.

FIG. 8 is a flowchart corresponding to the monitoring of the surrounding temperature. The flowchart shown in FIG. 8 is basically the same as the flowchart shown in FIG. 5. The flowchart shown in FIG. 8 is different from the flowchart shown in FIG. 5 in that processes of Steps S61 and S62 are added. Following the processes of Steps S51 and S52, in Step S61, the power supply device 100 determines whether or not the slope of the temperature is large. For example, the power supply device 100 determines that the slope of the temperature is large when the slope of the internal temperature exceeds the threshold value. When the slope of the temperature is large (YES in Step S61), the process proceeds to Step S62, and the power supply device 100 generates an alarm. A mode of the alarm is not particularly limited, and examples thereof include lighting of an LED lamp, generating of a sound, and displaying of an error code by the display circuit 23a. Following Step S62, the power supply device 100 may stop the output.

On the other hand, when the slope of the temperature is small (for example, the slope of the internal temperature is less than the threshold value), the process proceeds to Step S52 (NO in Step S61). In this case, the process proceeds to Step S53. Since the process after Step S53 is the same as the above-described process, description thereof will not be repeated.

In the above-described embodiment, the power supply device 100 itself displays a state of the power supply device 100. As described above, in the power supply device 100, the surrounding temperature estimated by the calculation circuit 22 can be output from the communication circuit 25 to the outside. Therefore, the external device may display the state of the power supply device 100. Such an embodiment will be described below.

C. Embodiment of Power Supply System

Figure 9:
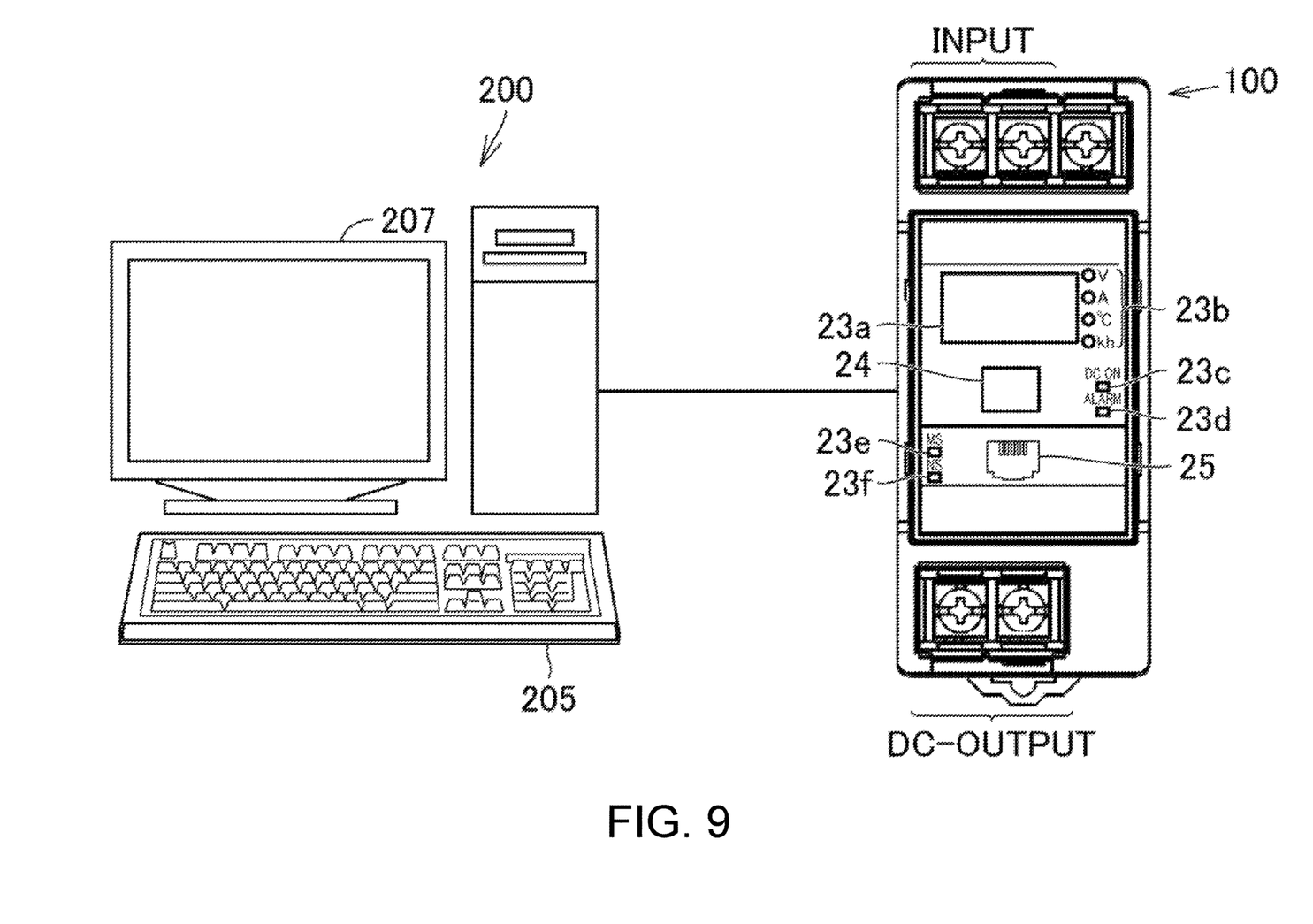
FIG. 9 is a schematic diagram for explaining a configuration of a power supply system according to an embodiment of the present disclosure.

FIG. 9 is a schematic diagram for explaining a configuration of the power supply system according to the embodiment of the present disclosure. The power supply system shown in FIG. 9 is configured of the power supply device 100 and a PC 200 (an information processing device) connected to the power supply device 100.

The PC 200 can monitor and display an operating state of the power supply device 100 using the surrounding temperature estimated by the power supply device 100. That is, the PC 200 also serves as a management device for the power supply device 100. The PC 200 displays in which a portion of the power supply operating range (a derating curve 70) the power supply device 100 is being operated. The PC 200 estimates a remaining life span of the power supply device 100 based on the operating state of the power supply device 100 and a remaining life span of the power supply device 100 when the operating state is changed. The PC 200 displays the operating state of the power supply device 100 and the estimated remaining life span together.

The PC 200 is communicably connected to the power supply device 100 by a connection cable 210. The power supply device 100 and the PC 200 are not limited to being connected by the wired connection cable 210, and may be connected by a wireless network.

The PC 200 can display a current operating state of the power supply device 100, a remaining life span of the power supply device 100 when the current operating state is continued, and a predicted remaining life span when the operating state of the power supply device 100 is changed. Therefore, it is possible to provide convenience for the user. The user can adjust the remaining life span of the power supply device based on the display. For example, the user can adjust one or both of a load and a temperature of the power supply device 100 to adjust the remaining life span of the power supply device 100. A maintenance plan of the power supply device 100 can be adjusted by extending the remaining life span of the power supply device 100. The user can reduce man-hours required for adjusting the power supply device 100.

The PC 200 (the information processing device) will be described below. Although an example in which the PC 200 is used as a unit which displays the operating state of the power supply device 100 has been described, the present disclosure is not limited thereto, and the operating state of the power supply device 100 may be displayed by various types of display units such as a mobile phone, a smart phone, a tablet terminal, a mobile PC, and the like.

Figure 10:
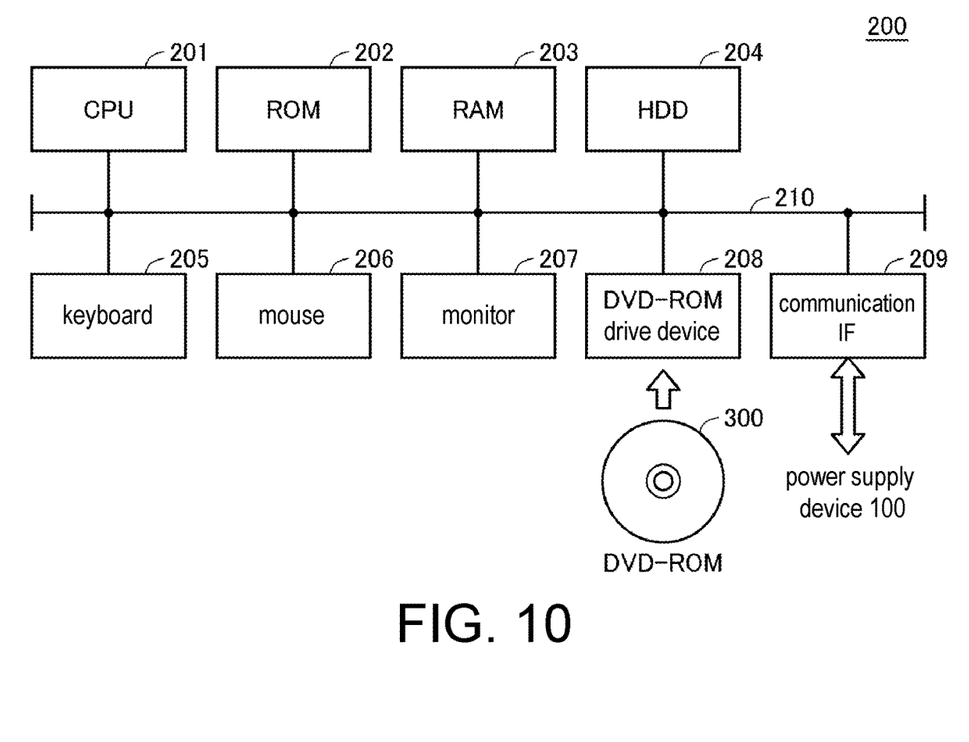
FIG. 10 is a block diagram showing a hardware configuration of a PC.

FIG. 10 is a block diagram showing a hardware configuration of the PC 200. Referring to FIGS. 9 and 10, the PC 200 includes a CPU 201 which executes a program, a read only memory (ROM) 202 which stores data non-volatilely, a RAM 203 which volatilely stores data generated by executing a program by the CPU 201 or data input via a keyboard 205 or a mouse 206, a hard disk drive (HDD) 204 which stores data non-volatilely, the keyboard 205 and the mouse 206 which receive an input of an instruction from the user of the PC 200, a monitor 207, a DVD-ROM drive device 208, and a communication IF 209, as main components. The components are connected to each other by a data bus. The DVD-ROM 300 is mounted in the DVD-ROM drive device 208.

The process in the PC 200 is realized by each hardware and software executed by the CPU 201. Such software may be stored in the HDD 204 in advance. Further, the software may be stored in the DVD-ROM 300 or other storage medium and may be distributed as a program product. Alternatively, the software may be provided as a program product which can be downloaded by an information provider connected to so-called Internet. Such software is read from the storage medium by the DVD-ROM drive device 208 or other reading device or downloaded via the communication IF 209, and is then temporarily stored in the HDD 204. The software is read from the HDD 204 by the CPU 201 and stored in the RAM 203 in the form of an executable program. The CPU 201 executes the program.

Each of the components constituting the PC 200 shown in FIG. 10 is a general one. Therefore, it can be said that an essential part of the present disclosure is software stored in the RAM 203, the HDD 204, the DVD-ROM 300 or other storage medium, or software which can be downloaded via a network. Since an operation of each hardware of the PC 200 is well known, detailed description thereof will not be repeated.

The recording medium is not limited to a DVD-ROM, a CD-ROM, a flexible disk (FD), and a hard disk, and may be a medium such as a magnetic tape, a cassette tape, an optical disc (a magnetic optical disc (MOD), a mini disc (MD), and a digital versatile disc (DVD)), an integrated circuit (IC) card (including a memory card), an optical card, a mask ROM, an electronically programmable read-only memory (EPROM), an electronically erasable programmable read-only memory (EEPROM), or a semiconductor memory such as a flash ROM which fixedly supports a program. Further, the recording medium is a non-temporary medium in which the program or the like can be read by a computer.

The program referred to here includes not only a program which can be directly executed by the CPU, but also a source program format program, a compressed program, an encrypted program, and the like.

Figure 11:
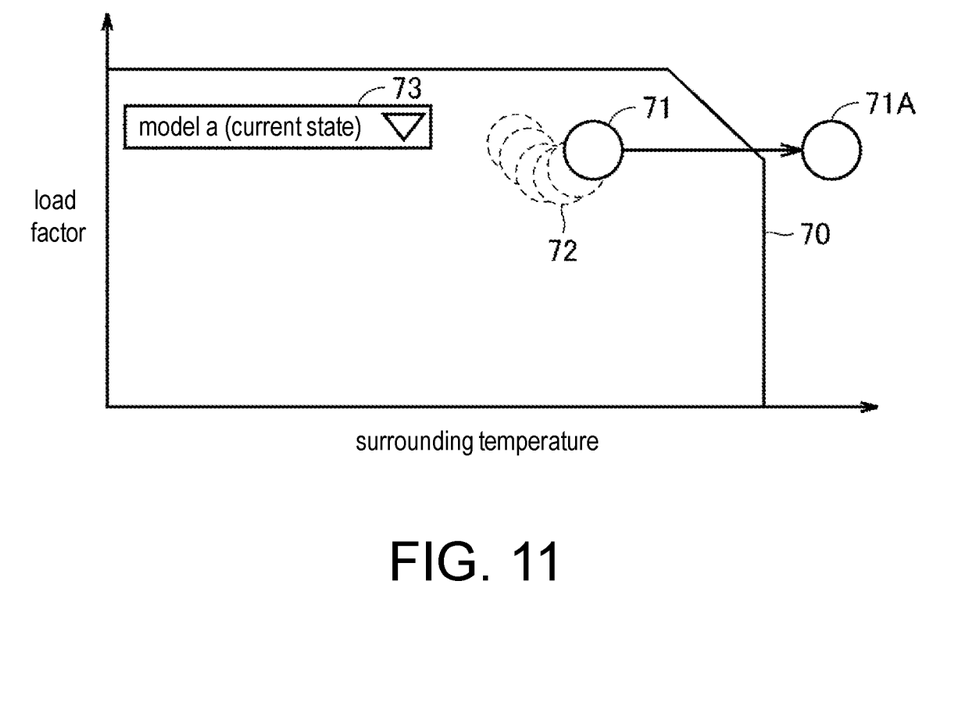
FIG. 11 is a schematic view showing an example of an operating state of the power supply device of the power supply system according to the embodiment of the present disclosure.

FIG. 11 is a schematic view showing an example showing an operating state of the power supply device 100 of the power supply system according to the embodiment of the present disclosure. In the display shown in FIG. 11, the surrounding temperature of the power supply device 100 is set on a horizontal axis, and the load factor is set on a vertical axis, and the derating curve 70 is displayed as a usage condition of the power supply device 100. Here, the derating curve is a usage condition which can guarantee each of specifications of the power supply device 100, and is defined from the "surrounding temperature" at which the device is used and the "load factor" of the device. The derating curve 70 is defined for each of models in consideration of operating characteristics of an internal circuit due to a temperature rise of internal parts and a temperature environment. The load factor is a ratio (%) of a load current to a rated current when a load is connected to the power supply device 100.

As described above, the power supply device 100 estimates the surrounding temperature from the output current and the internal temperature of the temperature sensor 28. The PC 200 calculates the load factor using the current measured inside the power supply device 100 as the load current when the load is connected, and obtains the operating state of the power supply device 100 at the surrounding temperature estimated by the power supply device 100. That is, the PC 200 obtains coordinates (the surrounding temperature, and the load factor) on the display shown in FIG. 11. The load factor of the power supply device 100 may be obtained by the power supply device 100 itself and may be output to the PC 200.

The PC 200 compares the obtained operating state (the coordinates) of the power supply device 100 with the predetermined derating curve 70 for on the monitor 207. Specifically, in the display shown in FIG. 11, a current operating state 71 of the power supply device 100 is displayed in the derating curve 70.

Further, in the display shown in FIG. 11, in addition to the current operating state 71 of the power supply device 100, a past operating state 72 of the power supply device 100 is displayed. It is possible to grasp details of the operating state of the power supply device 100 and to easily predict a future transition thereof by displaying the past operating state 72 of the power supply device 100.

Further, the display shown in FIG. 11 may indicate the operating state of the power supply device 100 at the surrounding temperature predicted based on the temperature rise. An operating state 71A is an operating state predicted based on the temperature rise.

The display shown in FIG. 11 includes a model display unit 73 which displays information on a displayed model. On the model display unit 73, a model of the current power supply device 100 installed in a control panel is displayed as a "model A (a current state)".

The HDD 204 of the PC 200 stores data measured in advance for power supply devices of a plurality of models having different specifications, and stores, for example, a operating state of a model B having a larger power supply capacity than that of the current power supply device 100, an operating state of a model C having a smaller power supply capacity than that of the current power supply device 100, and the like. Further, the HDD 204 of the PC 200 also stores data measured in advance in the power supply device for each of seasons and data such as a change in the derating curve due to a secular change of the power supply device 100.

Therefore, the PC 200 can perform a simulation when the current power supply device 100 is replaced with the power supply device of the model B or when the current power supply device 100 is replaced with the power supply device of the model C.

D. Appendix

As described above, this embodiment includes the following disclosure.

(Configuration 1)

A power supply device 100 includes:
a power supply unit 10,
a measurement unit 28 which measures an internal temperature of the power supply unit 10,
a calculation unit 22 which predicts an end-point temperature from the internal temperature of the power supply unit 10 measured by the measurement unit 28 and a slope of an internal temperature rise and estimates a surrounding temperature based on the end-point temperature and a load status of the power supply unit 10, and
an output unit 23 which outputs the surrounding temperature estimated by the calculation unit 22.

(Configuration 2)

The power supply device 100 described in Configuration 1 further includes a storage unit 27 which stores a correspondence table of the surrounding temperature based on the internal temperature and the load status, and
the calculation unit 22 estimates the surrounding temperature corresponding to the predicted end-point temperature and the load status from the correspondence table stored in the storage unit 27.

(Configuration 3)

In the power supply device 100 described in Configuration 1 or 2, the measurement unit 28 measures a value of a temperature sensor as the internal temperature, and the measurement unit 28 detects a temperature of a component constituting the power supply unit 10.

(Configuration 4)

In the power supply device 100 described in any one of Configurations 1 to 3, the power supply device 100 generates an alarm when the slope of the internal temperature rise exceeds a predetermined value.

(Configuration 5)

A power supply system includes:
the power supply device described in any one of Configurations 1 to 4, and a calculation processing device 200 which obtains an operating state of the power supply device 100 at the surrounding temperature estimated by the power supply device 100,
the calculation processing device 200 compares the operating state of the power supply device 100 that is obtained with a predetermined usage condition for display on a display unit 207.

(Configuration 6)

In the power supply system described in Configuration 5, the calculation processing device 200 also displays a time-series change in the operating state of the power supply device 100 on the display unit 207.

It should be considered that the embodiment disclosed this time is exemplary in all respects and is not restrictive. The scope of the present disclosure is indicated by the scope of claims, not the above description, and is intended to include all modifications within the meaning and scope of the claims.

The invention claimed is:

1. A power supply device comprising:
a power supply unit;
a measurement unit which measures an internal temperature of the power supply unit;
a calculation unit which predicts an end-point temperature from the internal temperature of the power supply unit measured by the measurement unit and a slope of an internal temperature rise and estimates a surrounding temperature of the power supply unit based on the predicted end-point temperature and a load status of the power supply unit; and
an output unit which outputs the estimated surrounding temperature.

2. The power supply device according to claim 1, further comprising a storage unit which stores a correspondence table which records a correspondence among a surrounding temperature, the internal temperature, and the load status,
wherein the calculation unit estimates the surrounding temperature based on the predicted end-point temperature and the load status from the correspondence table stored in the storage unit.

3. The power supply device according to claim 1, wherein the measurement unit measures a value of a temperature sensor as the internal temperature, and the temperature sensor detects a temperature of a component constituting the power supply unit.

4. The power supply device according to claim 1, wherein the power supply device generates an alarm when the slope of the internal temperature rise exceeds a predetermined value.

5. A power supply system comprising:
the power supply device according to claim 1; and
a calculation processing device which obtains an operating state of the power supply device corresponding to the estimated surrounding temperature estimated by the power supply device,
wherein the calculation processing device compares the obtained operating state of the power supply device with a predetermined usage condition for displaying the obtained operating state on a display unit.

6. The power supply system according to claim 5, wherein the calculation processing device also displays a time-series change in the obtained operating state of the power supply device on the display unit.

* * * * *